United States Patent
Kim et al.

(10) Patent No.: US 11,887,815 B2
(45) Date of Patent: Jan. 30, 2024

(54) PLASMA PROCESSING SYSTEM AND METHOD USING RADIO FREQUENCY (RF) AND MICROWAVE POWER

(71) Applicant: Tokyo Electron Limited, Tokyo (JP)

(72) Inventors: Yunho Kim, Choes, NY (US); Yanxiang Shi, Clifton Park, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 298 days.

(21) Appl. No.: 17/307,691

(22) Filed: May 4, 2021

(65) Prior Publication Data

US 2022/0246386 A1 Aug. 4, 2022

Related U.S. Application Data

(60) Provisional application No. 63/145,048, filed on Feb. 3, 2021.

(51) Int. Cl.
*H01J 37/32* (2006.01)
*H01J 37/18* (2006.01)
*H01L 21/67* (2006.01)

(52) U.S. Cl.
CPC ........ *H01J 37/32266* (2013.01); *H01J 37/18* (2013.01); *H01J 37/3211* (2013.01); *H01J 37/3222* (2013.01); *H01J 37/32091* (2013.01); *H01J 37/32119* (2013.01); *H01J 37/32229* (2013.01); *H01J 37/32715* (2013.01); *H01J 2237/327* (2013.01); *H01J 2237/334* (2013.01); *H01L 21/67069* (2013.01)

(58) Field of Classification Search
CPC ............ H01J 37/3222; H01J 37/32091; H01J 37/32119; H01J 37/32229; H01J 37/32266; H01J 37/32715
See application file for complete search history.

(56) References Cited

U.S. PATENT DOCUMENTS

| | | | | |
|---|---|---|---|---|
| 8,281,739 B2* | 10/2012 | Tiner | ................ | H01J 37/32651 118/723 R |
| 9,385,021 B2* | 7/2016 | Chen | ................ | H01J 37/32091 |
| 11,670,488 B2* | 6/2023 | Savas | ................ | H01J 37/32183 315/111.21 |

(Continued)

OTHER PUBLICATIONS

Erementchouk, Mikhail, "Electrodynamics of spoof plasmons in periodically corrugated waveguides," 472, http://dx.doi.org/10.1098/rspa.2016.0616, Department of Electrical Engineering and Computer Science, Oct. 2016, Proceedings R. Society, A, 21 pages.

(Continued)

*Primary Examiner* — Tung X Le
(74) *Attorney, Agent, or Firm* — Slater Matsil, LLP

(57) ABSTRACT

In one example, a plasma processing system includes a vacuum system, a plasma processing chamber including a chamber cavity coupled to the vacuum system, a substrate holder including a surface disposed inside the chamber cavity, a radio frequency (RF) source electrode coupled to an RF power source, the RF source electrode configured to ignite plasma in the chamber cavity. The system includes a microwave source coupled to a microwave oscillator, and a conductive spatial uniformity component including a plurality of through openings, where the conductive spatial uniformity component includes a major surface electromagnetically coupled to the microwave source, the major surface configured to couple microwave power to the plasma in the chamber cavity.

18 Claims, 10 Drawing Sheets

(56) References Cited

U.S. PATENT DOCUMENTS

| | | | | |
|---|---|---|---|---|
| 2006/0228496 | A1* | 10/2006 | Choi | H01J 37/3244 |
| | | | | 118/715 |
| 2010/0264117 | A1* | 10/2010 | Ohmi | C23C 16/52 |
| | | | | 118/692 |
| 2011/0061814 | A1* | 3/2011 | Ikeda | H01J 37/32192 |
| | | | | 315/111.21 |
| 2015/0147894 | A1* | 5/2015 | Hamano | H01L 21/67126 |
| | | | | 438/795 |
| 2016/0276139 | A1* | 9/2016 | Osada | H01J 37/3222 |

OTHER PUBLICATIONS

Humboldt University Berlin, https://www.physik.hu-berlin.de/de/nano/lehre/Gastvorlesung%20Wien/plasmonics, Chapter 7, "Plasmonics," downloaded Mar. 13, 2021, 32 pages.

Kim, Yunho, et al., "Surface plasma discharge generated by spoof surface plasmon polariton excitation: a computational modeling study," 2019 Journal of Physics D: Applied Physics 52, 445203, 19 pages.

Lee, Min Kyung, et al., "Add-on unidirectional elastic metamaterial plate cloak," Scientific Reports, www.nature.com/scientificreports.com, Feb. 10, 2016, 10 pages.

Maier, Stefan Alexander, "Plasmonics: Fundamentals and Applications," Centre for Photonics and Photonic Materials, Department of Physics, University of Bath, UK, May 16, 2007, 214 pages.

Photonics Laboratory, "Surface plasmons," Chapter 12, https://www.photonics.ethz.ch/fileadmin/user_upload/Courses/NanoOptics/plasmonss.pdf, Nov. 19, 2014, 44 pages.

Singh, Pramod K., et al., "Metamaterials for Remote Generation of Spatially Controllable Two Dimensional Array of Microplasma," Scientific Reports, www.nature.com/scientificreports.com, Aug. 7, 2014, 5 pages.

* cited by examiner

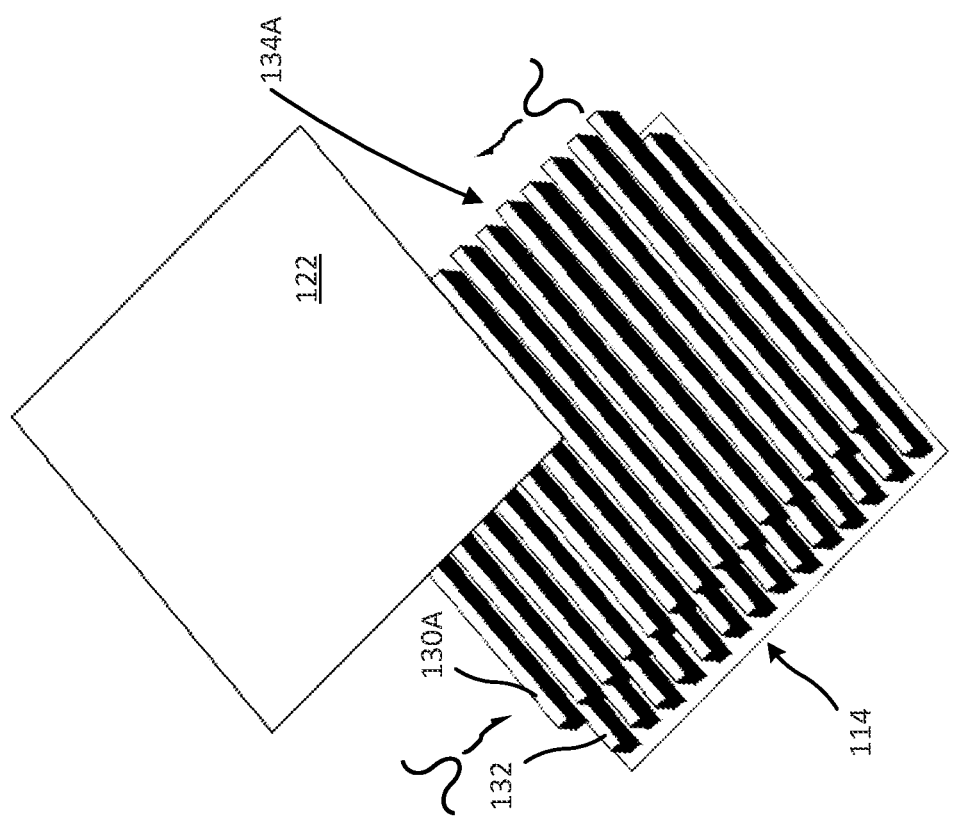

PLASMA PROCESSING SYSTEM AND METHOD USING RADIO FREQUENCY (RF) AND MICROWAVE POWER

CROSS-REFERENCE TO RELATED APPLICATIONS

This application claims the benefit of U.S. Provisional Application No. 63/145,048, filed on Feb. 3, 2021, which application is hereby incorporated herein by reference.

TECHNICAL FIELD

The present invention relates generally to a system and method for plasma processes, and, in particular embodiments, to a system and method for plasma processing of a semiconductor wafer using radio frequency (RF) and microwave power.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processing techniques, including sputtering, reactive ion etching (RIE), plasma-enhanced chemical vapor deposition (PECVD), and plasma-enhanced atomic layer etch (PEALE) and atomic layer deposition (PEALD).

At each successive technology node, the minimum feature sizes have been shrunk to reduce cost by roughly doubling the component packing density. Innovations in patterning such as immersion photolithography, multiple patterning, and 13.5 nm wavelength extreme ultraviolet (EUV) optical systems have reduced critical feature sizes to about ten nanometers. Concurrently, unconventional materials such as organics, ferroelectrics, and chalcogenides are being increasingly used in products. This scenario poses a challenge for plasma technology to provide platforms for patterning features with accurate sizing, precise placement, and tight control, often at atomic scale dimensions. Meeting this challenge along with the uniformity and repeatability requirements for high volume IC manufacturing needs further innovation.

SUMMARY

A plasma processing system includes a vacuum system, a plasma processing chamber including a chamber cavity coupled to the vacuum system, a substrate holder including a surface disposed inside the chamber cavity, a radio frequency (RF) source electrode coupled to an RF power source, the RF source electrode configured to ignite plasma in the chamber cavity. The system includes a microwave source coupled to a microwave oscillator, and a conductive spatial uniformity component including a plurality of through openings, where the conductive spatial uniformity component includes a major surface electromagnetically coupled to the microwave source, the major surface configured to couple microwave power to the plasma in the chamber cavity.

A plasma processing system including: a plasma processing chamber; a radio frequency (RF) source electrode coupled to an RF power source, the RF source electrode configured to ignite plasma in the plasma processing chamber; a microwave power system coupled to the plasma with microwave power, the microwave power system including: a conductive spatial uniformity component including a plurality of through openings, the conductive spatial uniformity component including a major surface configured to couple microwave power to the plasma in the plasma processing chamber; a microwave source coupled to a microwave oscillator; and a controller configured to execute instructions to adjust a spatial uniformity metric of electromagnetic (EM) power supplied to the plasma.

A method for plasma processing of a semiconductor wafer, the method including: loading the semiconductor wafer in a plasma processing chamber coupled to a radio frequency (RF) source electrode and a microwave power system including a conductive spatial uniformity component including a plurality of through openings, the conductive spatial uniformity component including a major surface coupled to a depth adjuster, a microwave oscillator and a microwave source; igniting plasma by coupling RF power from the RF source electrode to gas in the plasma processing chamber; coupling microwave power from the microwave power system to a plasma ignited in the plasma processing chamber by coupling the microwave oscillator to the microwave source; and changing, with the depth adjuster component, an unfilled depth of the plurality of through openings to control a combined electromagnetic (EM) power being supplied to the plasma where controlling the combined EM power adjusts a spatial uniformity metric of EM power.

BRIEF DESCRIPTION OF THE DRAWINGS

For a more complete understanding of the present invention, and the advantages thereof, reference is now made to the following descriptions taken in conjunction with the accompanying drawings, in which:

FIG. 1B is a perspective view of an EM metasurface, in accordance with an embodiment;

DETAILED DESCRIPTION OF ILLUSTRATIVE EMBODIMENTS

Figure 1A:
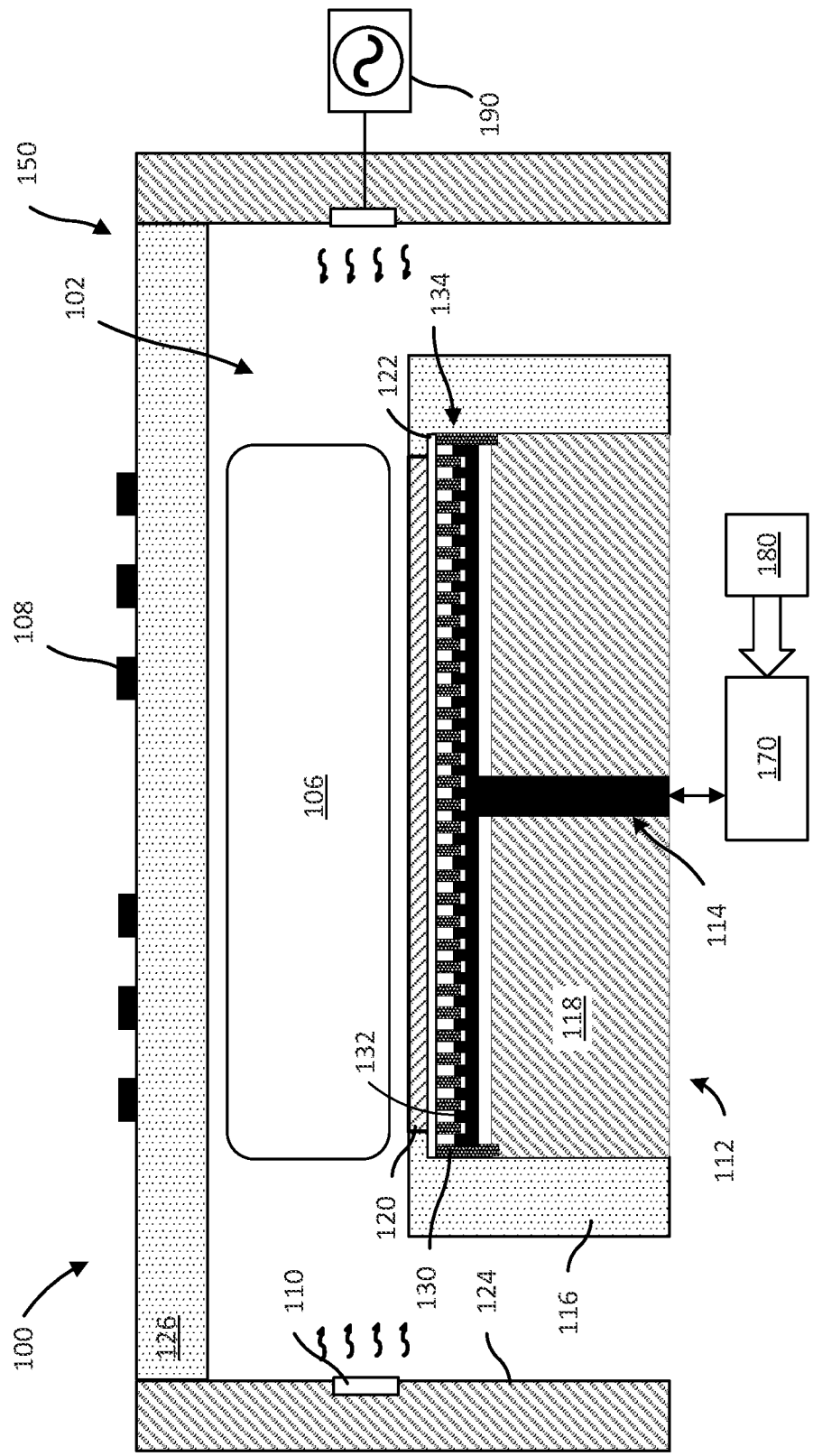
FIG. 1A is a cross-sectional view of an inductively coupled plasma (ICP) processing chamber with an electromagnetic (EM) metasurface in a substrate holder of the ICP chamber, in accordance with an embodiment.

This disclosure describes embodiments of plasma processing systems and methods for processing a semiconductor wafer, where radio frequency (RF) power is supplemented with microwave power in a total electromagnetic (EM) power applied to ignite, sustain, and control plasma in a plasma processing chamber. The spatial distribution of microwave power coupled to plasma may be different from, and complementary to, the spatial distribution of RF power coupled to plasma. It is desirable to have a spatially uniform distribution of combined EM power coupled to the plasma. In the example embodiments, plasma may be ignited and sustained using power from an RF power source, while a microwave power system providing microwave power from a microwave source is used to adjust a spatial distribution of the total electromagnetic (EM) power supplied to the plasma. The adjustment may improve a spatial uniformity metric of the total EM power supplied to the plasma. By utilizing two independent sources of EM power, the systems and methods illustrated by example embodiments in this disclosure provide an advantage of achieving more uniform plasma and, hence, more spatially uniform characteristics for the processed semiconductor wafer.

The adjustment to the EM power distribution is effected from outside the plasma processing chamber using a controller to control the microwave power that gets coupled to the plasma, as described in further detail below. Accordingly, the embodiments provide an advantage of having a plasma control parameter that may be used to adjust the distribution of EM power. A specific control parameter value may be selected for a particular plasma process recipe, and/or a specific set of values may be selected for a particular cyclic or multi-step plasma process recipe, for example, for multi-step plasma etching. The control parameter values may be selected by a process control system as part of a feedback or feed forward control in a process flow for semiconductor device fabrication.

In the embodiments described in this disclosure, stationary surface EM waves in the microwave frequency band are excited on an EM metasurface placed in proximity of plasma inside the processing chamber in order to couple microwave power from a microwave source to plasma. In general, an EM metasurface refers to a repetitive two-dimensional (2D) arrangement of a pattern of conductor and insulator having sub-wavelength features. In the embodiments in this disclosure, the EM metasurface is a conductor comprising a plurality of through openings, referred to as a conductive spatial uniformity component. Incident EM radiation at or near a resonant frequency of the repeating unit of the 2D arrangement may excite surface EM waves. The repeating unit pattern may be a through opening having various shapes in various embodiments, as described in further detail below. One example of an EM metasurface is a conductive spatial uniformity component having a corrugated metal surface, which is an array of trench-shaped openings etched in a metal layer. When a quarter wavelength of an impinging EM radiation is substantially close to the depth of the corrugations, EM excitations propagating along the metal to dielectric interface in a direction perpendicular to the corrugations are observed. Such surface EM excitations are sometimes referred to as spoof surface plasmon polariton.

A surface plasmon polariton (SPP) is an EM surface wave at the interface between a dielectric and a conductor excited via coupling of EM fields to electron plasma in metal using suitably designed couplers. Surface electromagnetic field oscillations on the dielectric side and plasma oscillations of free electrons on the metal side propagate confined to the interface with evanescent fields having subwavelength decay lengths perpendicular to the direction of the wave. Ordinarily, the oscillation frequency of SPP is high (e.g., $10^{14}$ Hz to $10^{15}$ Hz) because, at lower frequencies (e.g., $<10^{13}$ Hz), most metals behave as ideal conductors, which implies that the frequency-dependent complex dielectric constant has a real part equal to zero. Nevertheless, artificial SPP modes in the microwave range (e.g., $10^9$ Hz to $10^{11}$ Hz) have been demonstrated using EM metasurfaces that mimic the dispersion characteristics and field confinement of natural SPP; hence referred to as spoof surface plasmon polariton (SSPP).

In the embodiments described in this disclosure, the microwave power system comprises the microwave source coupled to the microwave oscillator and the conductive spatial uniformity component having a major surface. The major surface is configured to receive microwave power from the microwave source and couple microwave power to plasma. Surface EM excitations, similar to the SSPP excitations described above, are generated between two conductive regions: the conductive spatial uniformity component and the conductive charge-neutral region of the plasma which has high electron density. The dielectric between these two conductors includes the plasma sheath, which is a peripheral space-charge region of confined plasma that is depleted of mobile electrons. As mentioned above and described in further detail below, EM metasurfaces have a major surface comprising a unit pattern repeated in a 2D arrangement. In various embodiments, major surfaces may be of various patterns and arrangements. However, the major surfaces in this disclosure have one common feature. The major surface comprises an array of hollow through openings extending through a conductive matrix of the conductive spatial uniformity component.

A depth dimension of the through openings that influences the resonant frequency may be selected using a depth adjuster included in the embodiments of the plasma processing systems and disposed in the proximity of the EM metasurface. As described in further detail below, a conductive protrusion from the depth adjuster may extend into one end of each through opening, thereby partially filling the hollow opening. The extent of the unfilled portion of the opening from the opposite end is the depth dimension, d, referred to as the unfilled depth. The unfilled depth, d, is set by moving the position of a tip of the protrusion inside the opening using a mechanical system of the depth adjuster. It is understood that the mechanical system may include electrical components such as precision motors, electromagnets, and electronic control circuitry configured to receive command instructions from a controller disposed outside the plasma processing chamber.

As explained above, adjusting d adjusts the resonant frequency of the unit pattern of the major surface. Changing the resonant frequency changes the coupling between the microwave source and the major surface. As explained further below, this provides the plasma processing system the advantage of controlling the spatial distribution; hence adjust the spatial uniformity metric of EM power in order to achieve a more spatially uniform distribution of EM power coupled to the plasma.

FIG. 1A illustrates an example embodiment of a plasma processing system 100 comprising a plasma processing chamber 150 comprising a substrate holder 112. In FIG. 1A, the plasma processing chamber 150 is an inductively coupled plasma (ICP) processing chamber shown in a cross-sectional view. An RF source electrode 108, shaped like a planar coil disposed over a top cover comprising a dielectric window 126, is the RF source providing RF power to ignite and sustain plasma 106. The dielectric window 126 may comprise, for example, a ceramic such as quartz.

The microwave source of the plasma processing system 100 is microwave antennas 110 shown placed on the sidewall 124 of the plasma processing chamber 150. In this example embodiment, the sidewall 124 may comprise a conductive material, for example, aluminum or stainless steel coated with yttria. The microwave antennas 110 are coupled to a microwave oscillator 190 and configured to radiate EM waves inside the plasma processing chamber 150 in the microwave range. The radiation emitted from the antennas would have the same frequency, f, as the output signal of the microwave oscillator 190 coupled to the antenna 110. Microwave frequencies suitable for plasma processing may be from about 1 GHz to about 100 GHz in various embodiments and 2.45 GHz in one embodiment.

As illustrated in FIG. 1A, loaded on the substrate holder 112 is a semiconductor wafer 120 exposed to the ambient inside chamber cavity 102. The substrate holder 112 is generally an electrostatic chuck comprising a conductive pedestal, such as the conductive pedestal 118. A conductive spatial uniformity component 134 having a major surface 130 (the surface facing the chamber cavity 102) is attached to a top region of the pedestal 118. The major surface 130 is electromagnetically coupled to the antennas 110, such that a portion of the radiated microwave power may be received by the major surface 130 to excite the EM surface wave or SSPP. The major surface 130 comprises a pattern of hollow openings extending through a conductive matrix, as described in further detail below with reference to FIGS. 1B and 1C.

The depth adjuster 114 is coupled to the bottom side (the side opposite the major surface 130) of the conductive spatial uniformity component 134. The coupling is made using protrusions 132 supported by a conductive plate of the depth adjuster 114 that has been aligned to the patterned major surface 130 of the conductive spatial uniformity component 134 such that the conductive protrusions are vertically aligned with the through openings. The protrusions 132 also comprise a conductive material. The conductive plate may be supported by a vertical column of the depth adjuster 114 located opposite or adjacent to the conductive protrusions. The vertical column is shown passing through a central region of the pedestal 118 and terminating in a surface connected to a back side of the conductive plate (the side opposite the front side).

The opposite end of the vertical column may be coupled to components of the mechanical system 170, illustrated schematically in FIG. 1A. The mechanical system 170 may comprise actuators and moving parts configured to move the conductive protrusions 132 inside the hollow openings of the major surface 130 to achieve a specific depth dimension, d. The actuators may be, for example, electrical components such as electrical motors and electromagnets. The adjustments to the position of the conductive protrusions 132 may be achieved in various ways in various embodiments. For example, the tips of the conductive protrusions 132 may be raised or lowered by raising or lowering the vertical column and the depth adjuster plate supporting the conductive protrusions 132. In some embodiments, the motion may be actuated electrically using, for example, electric motors. In some other embodiments, there may be a pneumatic actuator used. There may also be additional moving parts along the vertical column and the conductive depth adjuster plate that mechanically transfer forces from the actuators in the mechanical system 170 to the conductive protrusions 132. It may even be possible to place actuators (e.g., magnets and electromagnets) adjacent to the conductive protrusions 132 that may be triggered remotely or wirelessly by electrical signals. The mechanical system 170 may be configured to receive command instructions from a controller 180 instructing the mechanical system to precisely position the tips of the conductive protrusions 132 to adjust d in steps of about 0.1 mm to about 5 mm, in various embodiments. The controller 180 may be configured to execute instructions to adjust a spatial uniformity metric of electromagnetic (EM) power supplied to the plasma. By executing the instructions, the controller 180 generates the command instructions in accordance with information provided in the plasma process recipe and, in some embodiments, may include additional information such as feedback from sensors used to monitor properties of the plasma or feed-forward information obtained from previously executed process steps.

The pedestal 118 serves as a conductive base over which the EM metasurface with the major surface 130 comprising the array of through openings may be attached. However, it is noted that the conductive pedestal 118 may be configured to additionally function as an RF bias electrode, a DC bias electrode, or ground connection, or a combination of a DC bias electrode and RF bias electrode. The conductors in the conductive spatial uniformity component 134 comprising the major surface 130, the depth adjuster 114, and the conductive pedestal 118 may comprise metals such as copper, aluminum, brass, and tungsten.

In the example embodiment illustrated in FIG. 1A, the EM metasurface comprises a conductive spatial uniformity component 134 and the major surface 130 of the EM metasurface comprises an array of through openings extending through the conductor of the conductive spatial uniformity component 134. In order to facilitate achieving more spatially uniform process characteristics for the semiconductor wafer 120, a major surface of the wafer 120 which may be exposed to plasma and the major surface of the EM metasurface, for example, the major surface 130 are oriented parallel to each other, with the major surface 130 located opposite the plasma sheath of plasma 106. Openings of various shapes are possible; some example patterns are described in further detail below with reference to FIGS. 1B and 1C. The openings are hollow and may be filled with insulating gas (e.g., air or nitrogen) that may be isolated in the substrate holder 112 from the ambient within the chamber cavity 102 by a separator 122 comprising a solid dielectric layer covering the major surface 130 of the conductive spatial uniformity component 134. This allows the insulating gas in the openings to be at a much higher pressure (e.g., atmospheric pressure) than the pressure in the chamber cavity 102, thereby help prevent occurrence of accidental arcing, likely in low pressure gas exposed to high electric fields. Suitable materials for the separator 122 include quartz, alumina and glass. The sides of the pedestal 118 are covered by an optional dielectric structure 116.

Figure 1C:
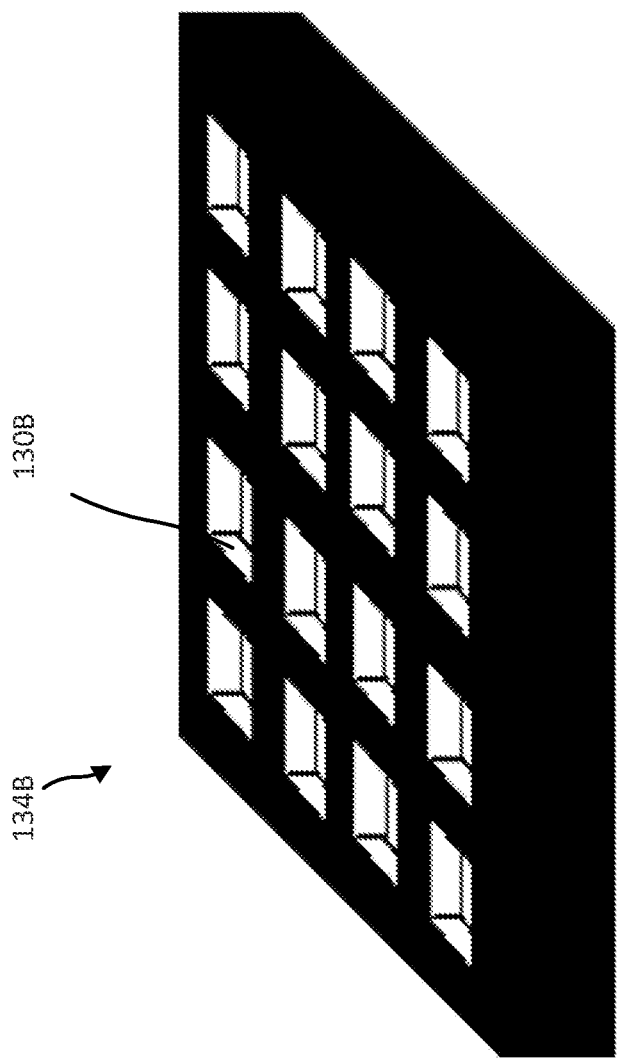
FIG. 1C is a perspective view of an EM metasurface, in accordance with an embodiment.

FIGS. 1B and 1C illustrate perspective views of two example conductive spatial uniformity components 134A and 134B that may be used as EM metasurfaces in the plasma processing system 100 shown in FIG. 1A. FIG. 1B additionally illustrates the depth adjuster 114 and the separator 122 in an exploded view. Either of the major surfaces 130A (in FIG. 1B) and 130B (in FIG. 1C) may be the major surface 130 of the EM metasurface illustrated in FIG. 1A.

In FIG. 1B, the major surface 130A comprises an array of long and narrow parallel line and space pattern formed of conductive lines spaced by a gas insulator. Although referred to as a surface wave, the oscillating electromagnetic field of the SSPP excitation exists in the dielectric region of the major surfaces 130A/130B as well as the dielectric region between the major surfaces 130A/130B and the plasma 106 (illustrated in FIG. 1A). Accordingly, the major surfaces 130A and 130B include the conductive sidewalls of the hollow openings, in addition to the conductive surface covered by the separator 122 on the side that faces the chamber cavity 102 (see FIG. 1A). Each hollow trench of the major surface 130A has roughly vertical conductive sidewalls and is terminated at the bottom by a roughly flat conductive tip of one of the protrusions 132 on the front side of the conductive plate of the depth adjuster 114. The portion of the conductive protrusion 132 extending into the hollow trench partially fills the through opening, leaving the remaining portion of the trench filled with gas up to the unfilled depth, d. All the trenches in the array may be terminated at roughly the same d by positioning the tips of the protrusions 132 inside the hollow openings using a mechanical system configured to slide the protrusions 132 along sidewalls of the through openings. The mechanical system may be configured to receive command instructions from a controller to adjust the unfilled depth, d. Using the mechanical system, the controller may adjust d to a desired value from outside the plasma processing chamber. The exploded view illustrated in FIG. 1B shows the separator 122 above the major surface 130A. The separator 122 is the solid dielectric layer used to cover the major surface 130 in FIG. 1A.

The major surface 130B, illustrated in FIG. 1C, comprises a rectangular array of through holes shaped like prisms that extend through the conductor. The conductive sides of the prism-shaped holes are roughly vertical. Similar to the major surface 130A, the major surface 130B also includes the conductive sidewalls of the hollow prisms, in addition to the conductive surface between prisms on the side that faces the chamber cavity 102. As described above for the major surface 130A, each of the holes in major surface 130B would be partially filled by the respective conductive protrusion protruding from the conductive plate of the respective depth adjuster, such as depth adjuster 114. The unfilled portion would be terminated from the bottom by the tips of protrusions 132. The unfilled depth, d, of the through openings in the major surface 130B may be adjusted by a mechanical system using the controller, similar to the mechanical system described above for adjusting d in major surface 130A. In the example illustrated in FIG. 1C, the through openings are shaped like square prisms. However, it is understood that prisms having other shapes such as cylinder and pyramid may be used. In various embodiments, the through openings may be tapered instead of prism-shaped, and the sides may be curved sides instead of being planar sides with edges.

The feature sizes of the patterned major surfaces 130A and 130B of the conductive spatial uniformity components 134A and 134B illustrated in FIGS. 1B and 1C determine the resonant modes for the structures. As mentioned above, incident EM radiation at a resonant frequency may excite the respective SSPP mode in the major surface of an EM metasurface. As indicated by wavy symbols with arrows in FIG. 1B, microwave radiation may be coupled to the conductive spatial uniformity component 134A at the edges of the major surface 130A. The SSPP mode, thereby excited, may propagate microwave power from the edges toward a central region of the major surface 130A. One condition for resonance for the major surfaces 130A and 130B is that the openings have depth, d, substantially close to $\lambda/4$, where $\lambda$ is the wavelength of the incident EM radiation. The $d=\lambda/4$ condition implies that for the range of microwave frequencies mentioned above, 1 GHz<f<100 GHz, the depth of the openings in the major surfaces 130A and 130B would have to be in the range 7.5 cm<d<0.75 mm. Generally, the sizes of various features on the major surfaces of the conductive spatial uniformity components used in various embodiments of plasma processing systems described in this disclosure may be nominally from about 1 mm to about 10 cm. The nominal depth, d, may be adjusted in small steps by the controller controlling the mechanical system of the depth adjuster 114. The step size may be from about 0.1 mm to about 5 mm.

Figure 2:
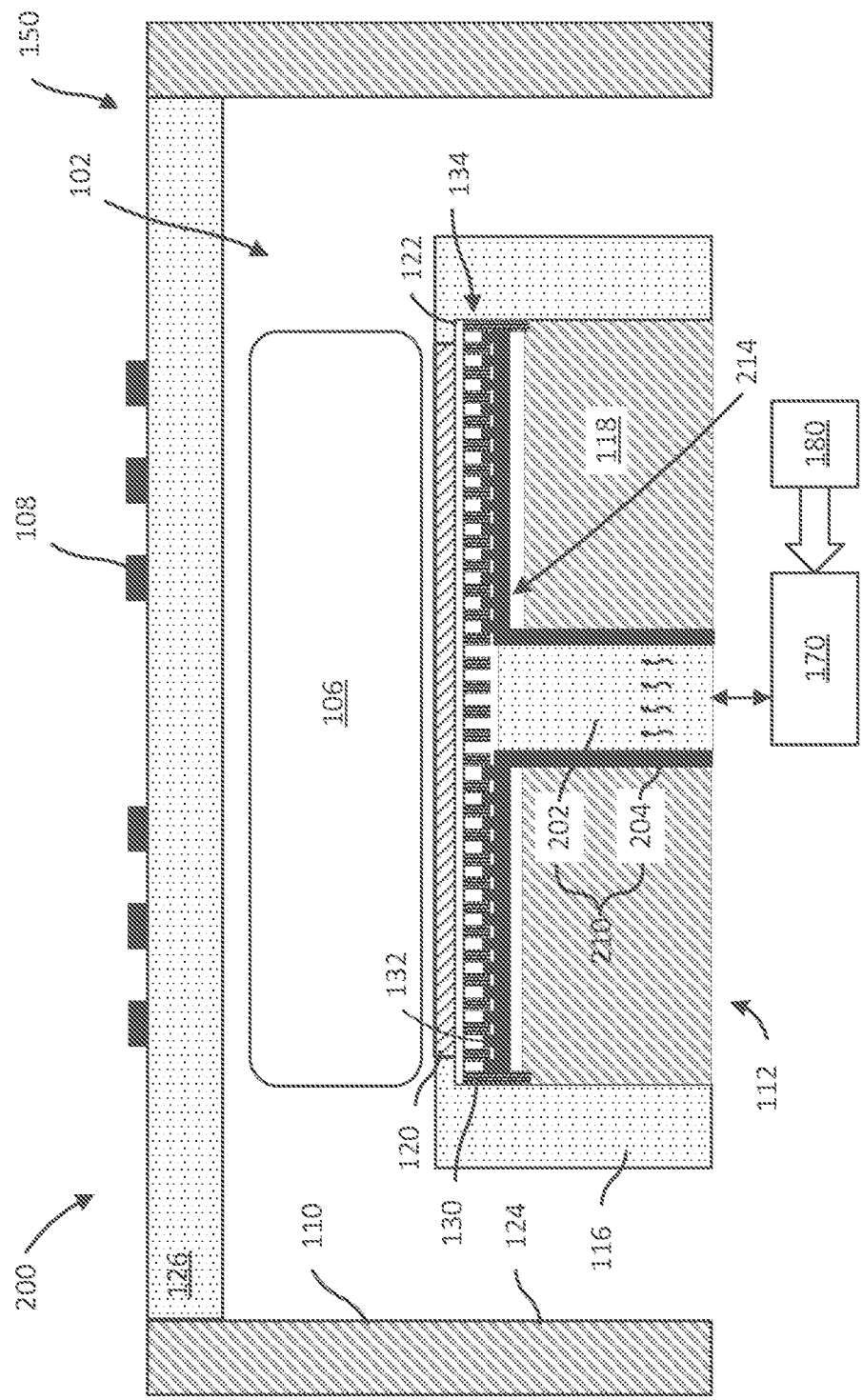
FIG. 2 is a cross-sectional view of an ICP processing chamber with an EM metasurface and a microwave waveguide in a substrate holder of the ICP chamber, in accordance with an embodiment.

FIG. 2 illustrates a cross-sectional view of another plasma processing system 200 that uses both RF power and microwave power to process the semiconductor wafer 120 in a plasma processing chamber 150 configured as an ICP chamber. Similar to the plasma processing system 100, described above with reference to FIG. 1A, the RF source electrode 108 is disposed over the dielectric window 126.

Also similar to the plasma processing system 100, the EM metasurface in plasma processing system 200 is attached to the substrate holder 112 and has the major surface 130 comprising through openings of adjustable depth, d, adjusted by a depth adjuster 214. The openings in the major surface 130 are isolated from the ambient within the chamber cavity 102 by the separator 122. Similar to the plasma processing system 100, the substrate holder 112 in the plasma processing system 200 comprises a conductive pedestal 118. A vertical column supports the conductive plate of the depth adjuster 214 in the central region, and the sides of the pedestal 118 are covered by an optional dielectric structure 116. As described below with reference to FIG. 2, the vertical column functions as the microwave source creating surface EM excitations on the major surface 130.

In the plasma processing system 200, instead of using microwave antennas, a microwave waveguide 210 may be used as the microwave source. Waveguides are used for point-to-point transfer of EM power, similar to a transmission line. In the plasma processing system 200 illustrated in FIG. 2, the microwave waveguide 210, shown passing through the conductive pedestal 118 of the substrate holder 112, may be used to couple microwave power from a microwave oscillator to the major surface 130 of the EM metasurface.

The depth adjuster in various embodiments of the plasma processing systems described in this disclosure comprises the conductive plate comprising a side having conductive protrusions 132 extending into through openings of the major surface 130, the conductive plate connected to the vertical column located opposite or adjacent to the conductive protrusions. The vertical column may comprise a conductive outer wall connected to the conductive plate on one end and a mechanical system 170 on the opposite end. The mechanical system 170 may be configured to move the protrusions along sidewalls of each of the openings to adjust its unfilled depth to a desired value, d. The desired value of d may be selected by the controller 180 sending command instructions from outside the plasma processing chamber to operate the mechanical system 170 of the depth adjuster (e.g., depth adjuster 114 in FIG. 1A and depth adjuster 214 in FIG. 2).

The depth adjuster 214 in the plasma processing system 200 is similar to the depth adjuster 114, except the vertical column connected to the conductive plate with protrusions doubles as a microwave waveguide 210, as illustrated in FIG. 2. The waveguide 210 comprises a conductive outer wall 204 surrounding a waveguide dielectric 202. The waveguide 210 may be shaped as a pipe having a rectangular cross-section. In this embodiment, the conductive plate of the depth adjuster 214 has an opening in the central region aligned to a terminating surface of the vertical column. As illustrated in FIG. 2, the hole in the conductive plate exposes a portion of the conductive spatial uniformity component 134 to the end of the waveguide, thereby allowing the waveguide 210 to deliver microwave power to the exposed EM metasurface by exciting surface EM waves in the major surface 130. The microwave power coupled to the major surface 130 from the waveguide 210 may propagate towards the edges of the major surface 130 via the excited SSPP modes. The conductive outer wall 204 is connected to the side of the conductive plate opposite or adjacent to the protrusions, as illustrated in the cross-sectional view in FIG. 2. The conductive outer wall 204 may comprise, for example, copper, and the waveguide dielectric 202 may comprise a gas (e.g., air). However, as known to a person skilled in the art, in various embodiments the outer wall 204 may comprise other metals such as copper plated steel, aluminum, silver, or brass and the waveguide dielectric 202 may comprise nitrogen gas or a solid dielectric such as glass, silicon or quartz. In some embodiments, the microwave waveguide may be shaped like a cylindrical pipe.

The microwave waveguide 210 which, as explained above, doubles as the vertical column supporting the conductive plate of the depth adjuster 214, may be coupled to moving parts of the mechanical system 170. The mechanical system 170, controlled by the controller 180, may move the conductive protrusions of the depth adjuster 214 to achieve a specific depth, d for the hollow openings in the major surface 130.

Figure 3:
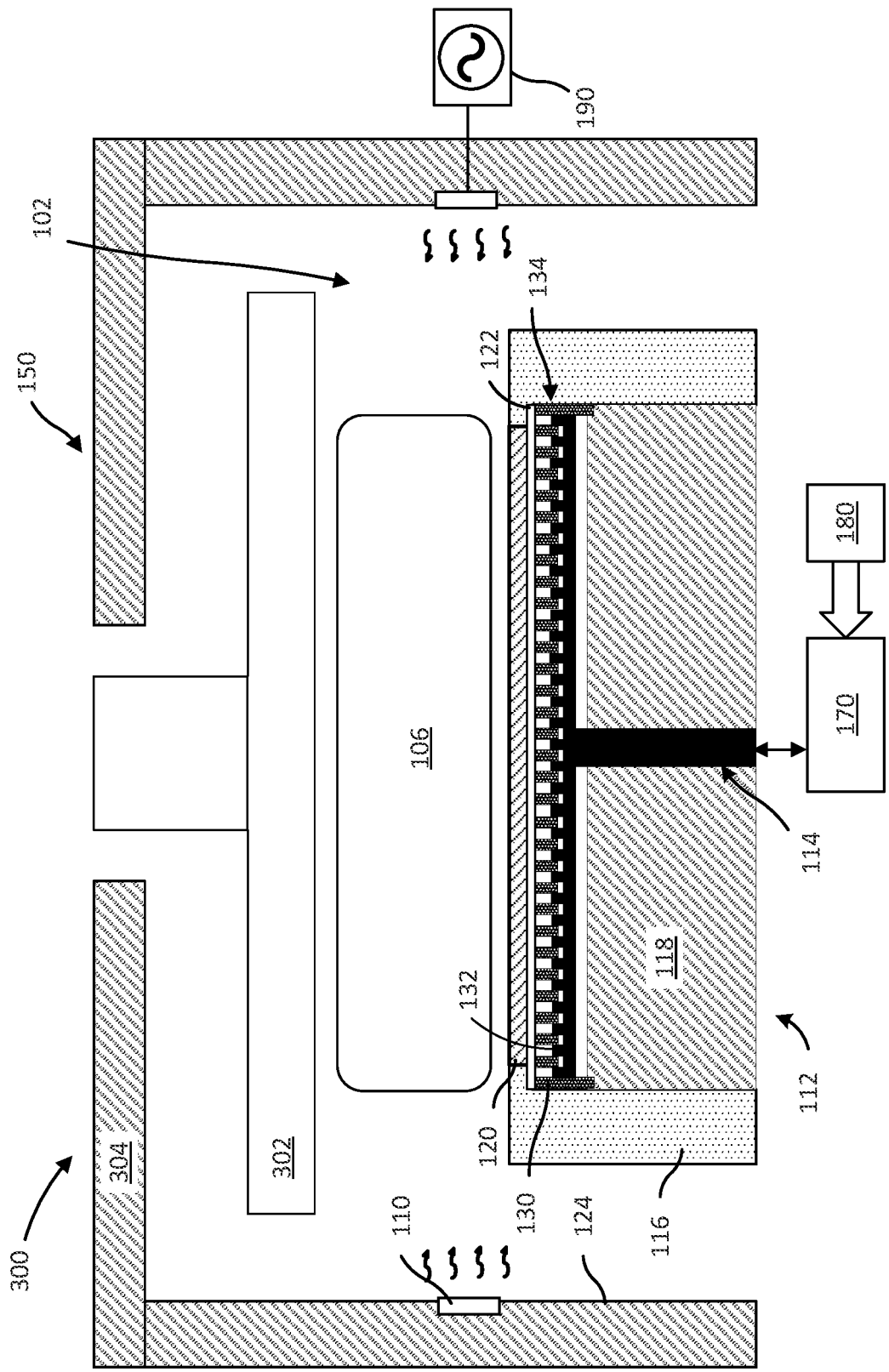
FIG. 3 is a cross-sectional view of a capacitively coupled plasma (CCP) processing chamber with an electromagnetic (EM) metasurface in a substrate holder of the CCP chamber, in accordance with an embodiment.

FIG. 3 illustrates an embodiment of a plasma processing system 300 where, similar to the plasma processing system 100 (illustrated in FIG. 1A), the microwave source is the microwave antennas 110, the substrate holder 112 comprises a conductive pedestal 118, the conductive spatial uniformity component 134 has the major surface 130 comprising hollow openings attached to a top region of the pedestal 118, and the depth adjuster 114 comprises a horizontal conductive plate with protrusions extending vertically into the openings and a vertical column passing through the central region of the pedestal 118. Unlike the plasma processing system 100, the plasma processing chamber 150 of plasma processing system 300 is configured as capacitively coupled plasma (CCP) chamber. Generally, in the CCP configuration, the RF source electrode has a substantially flat conductive surface (analogous to a plate of a parallel plate capacitor) and is disposed in the plasma processing chamber 150.

As illustrated in FIG. 3, the plasma processing system 300 comprises a top electrode shaped like a conductive plate, referred to as a CCP electrode 302. A central portion of the CCP electrode 302 may be extending through an opening in a top cover 304 of the plasma processing chamber 150. The opening may be part of a showerhead assembly used to flow gases into the chamber cavity 102. Gases may also be introduced into the chamber cavity 102 through gas inlets in the sidewall 124. In some embodiments, the CCP electrode 302 may be the RF source electrode, and the conductive pedestal 118 may be configured as a bottom electrode configured to function as an RF bias electrode, a DC bias electrode, or ground connection, or a combination of a DC bias electrode and RF bias electrode. In some other embodiments, the functions of the two electrodes may be reversed, and the CCP electrode 302 may be configured to function as an RF bias electrode, a DC bias electrode, or ground connection, or a combination of a DC bias electrode and RF bias electrode, while the conductive pedestal 118 may be configured as the RF source electrode.

As mentioned above, the microwave source in plasma processing system 300 is the microwave antennas 110 placed on the sidewall 124 of the plasma processing chamber 150. Microwave radiation emitted from the microwave antennas 110 may be electromagnetically coupled to the EM metasurface at the edge of the major surface 130. As explained above, microwave radiation at or near the resonant frequencies of the EM metasurfaces may excite respective SSPP modes by which microwave power may be propagated from the edges toward a central region of the major surface 130.

The mechanical system 170 and the controller 180 of the plasma processing system 300 may adjust the depth, d, of the major surface 130 using the depth adjuster 114, similar to the plasma processing system 100.

Figure 4:
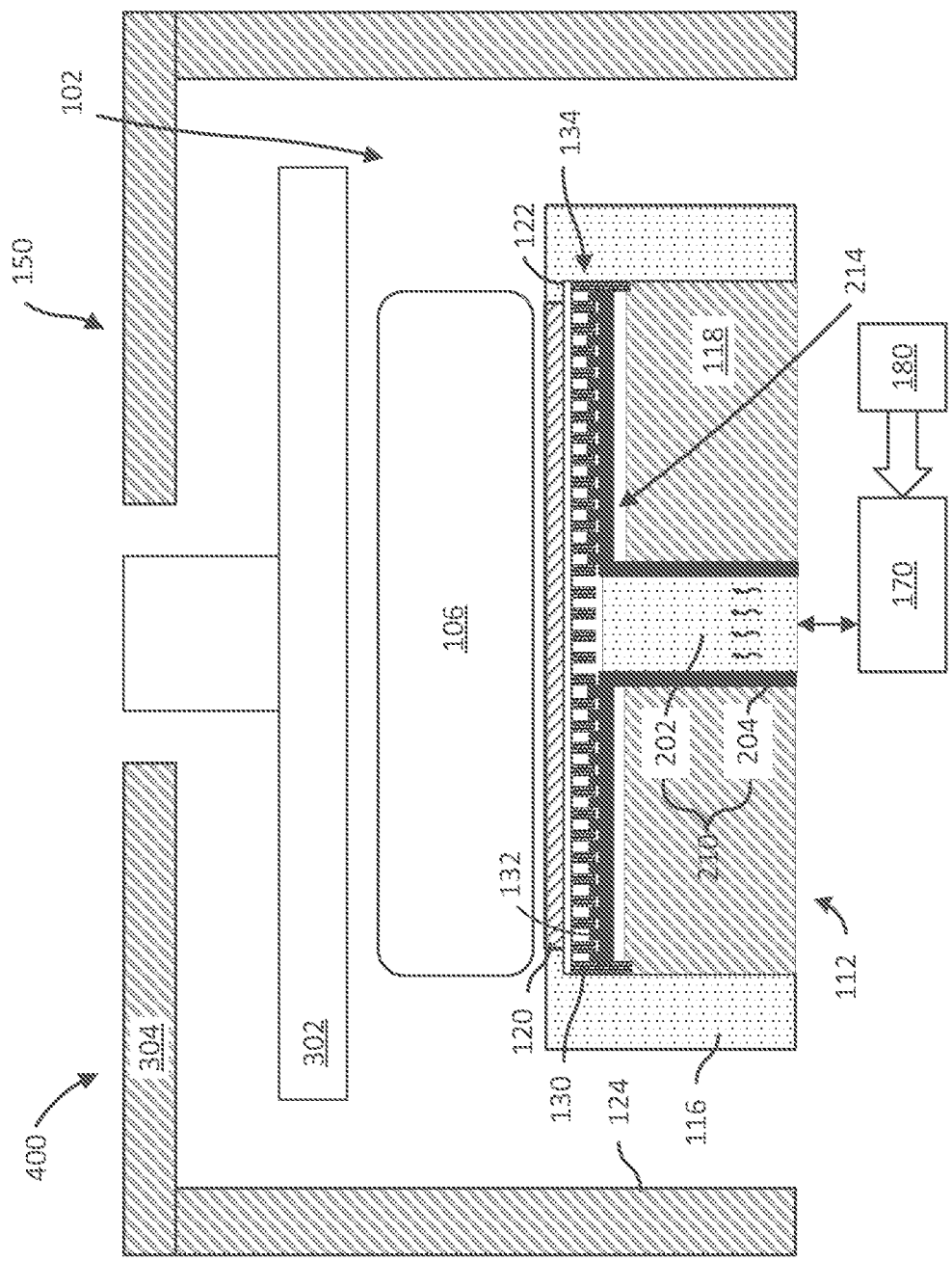
FIG. 4 is a cross-sectional view of a CCP processing chamber with an EM metasurface and a microwave waveguide in a substrate holder of the CCP chamber, in accordance with an embodiment.

FIG. 4 illustrates a cross-sectional view of an example plasma processing system 400 using both RF power and microwave power to process the semiconductor wafer 120, where the microwave source is similar to that of the plasma processing system 200 (see FIG. 2), and the RF source is similar to that of the plasma processing system 300 (see FIG. 3). Accordingly, the microwave power for exciting SSPP modes in the major surface 130 is delivered by the microwave waveguide 210 (described above with reference to FIG. 2), and either one of the CCP electrode 302 or the conductive pedestal 118 (configured as a bottom electrode) may be configured as the RF source electrode, the plasma processing chamber 150 being in the CCP chamber configuration (described above with reference to FIG. 3). Similar to the plasma processing system 200, the major surface 130 of the EM metasurface and the depth adjuster 214 of the plasma processing system 400 are located in the substrate holder 112, as illustrated in FIG. 4. The waveguide 210 couples microwave power to the major surface 130 through a central opening in the conductive plate of the depth adjuster 214. The depth adjustment may be achieved by positioning the conductive protrusions 132 of the conductive plate using the mechanical system 170 and the controller 180 controlling the operation of the mechanical system.

Figure 5:
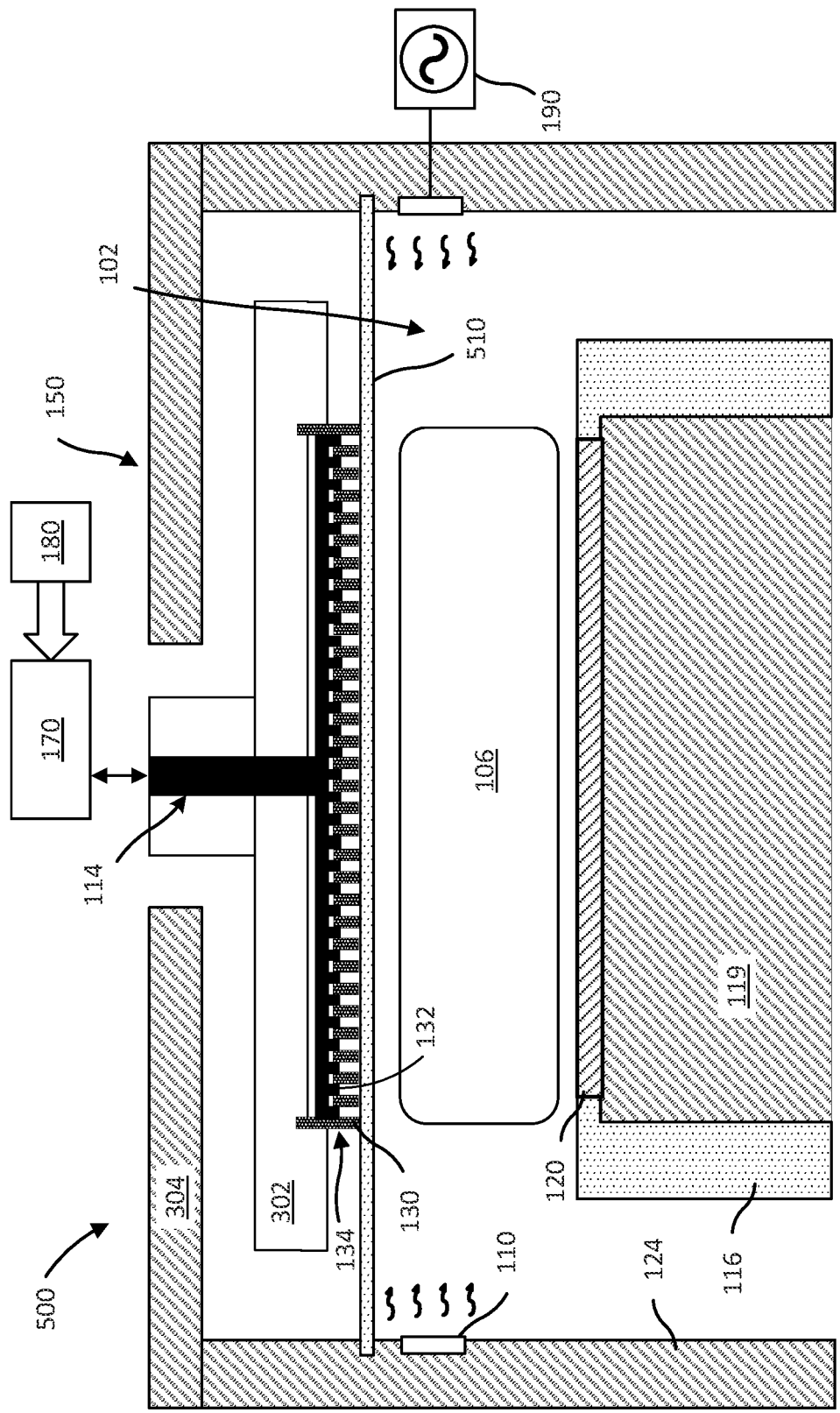
FIG. 5 is a cross-sectional view of a CCP processing chamber with an EM metasurface below a top electrode of the CCP chamber, in accordance with an embodiment.

FIG. 5 illustrates a cross-sectional view of the plasma processing system 500, where the plasma processing chamber 150 is configured as a CCP chamber, and the conductive spatial uniformity component 134 having the major surface 130 is attached to a bottom side of the CCP electrode 302. In the plasma processing system 500, the microwave power source comprises antennas 110 coupled to a microwave oscillator 190.

As in the other embodiments of plasma processing systems described in this disclosure, the major surface 130 of the conductive spatial uniformity component 134 in plasma processing system 500 comprises openings extending through a conductor. In the example embodiment illustrated in FIG. 5, the major surface 130 is facing the substrate holder 112. As illustrated in FIG. 5, the conductive spatial uniformity component 134 is coupled to the depth adjuster 114. Protrusions 132 of the depth adjuster 114 may be moved by the mechanical system 170 controlled by the controller 180.

The depth adjuster 114 in plasma processing system 500 and the depth adjuster 114 in plasma processing system 300 (described with reference to FIG. 3) are similar. However, because the major surface 130 in plasma processing system 500 is facing downward toward the chamber cavity 102 and the substrate holder 112, the orientation of the depth adjuster 114 in FIG. 5 has been reversed relative to the orientation of the depth adjuster 114 in FIG. 3. As illustrated in FIG. 5, the protrusions 132 on one side of the conductive plate extend downward (instead of upward) into the through openings of the major surface 130, and the vertical column connected to the side of the conductive plate that is opposite or adjacent to the side having the protrusions 132 goes upward through a central region of the CCP electrode 302 (instead of downward through the pedestal 118). The depth adjuster 114 includes the mechanical system 170 configured to receive command instructions from the controller 180 to move the protrusions 132 along sidewalls of the through openings. By positioning the tip of the protrusion inside each opening, the mechanical system adjusts the unfilled depth, d, of the through opening. As explained above, changing d alters the resonant frequency of the unit pattern of the major surface 130 of the EM metasurface.

As illustrated in FIG. 5, the major surface 130 of the conductive spatial uniformity component 134 of plasma processing system 500 is isolated from the ambient within the chamber cavity 102 by a separator 510. The separator 510 is shown to extend across the chamber like a second ceiling, leaving some space between the separator 510 and the top cover 304. Anchoring the separator 510 to the sidewall 124 provides an advantage of greater mechanical stability. However, in some other embodiment, the lateral extent of the separator 510 may be smaller, leaving a gap between the separator 510 and the sidewall 124. It is understood that the separator 510 may have various shapes in various embodiments.

It is noted that, for the plasma processing system 500, the substrate holder 112 does not include any part of the microwave power system (unlike the substrate holder 112 in the plasma processing systems 100, 200, 300, and 400). Accordingly, in some embodiments, such as the plasma processing system 500, the semiconductor wafer 120 may be placed over the top surface of the conductive pedestal 119. However, as known to a person skilled in the art, in some embodiments, the substrate holder 112 may be an electrostatic chuck comprising a dielectric top surface over the conductive pedestal 119. Similar to the conductive pedestal 118, the conductive pedestal 119 may also be configured to function as an RF bias electrode, a DC bias electrode, or ground connection, or a combination of a DC bias electrode and RF bias electrode.

Figure 6:
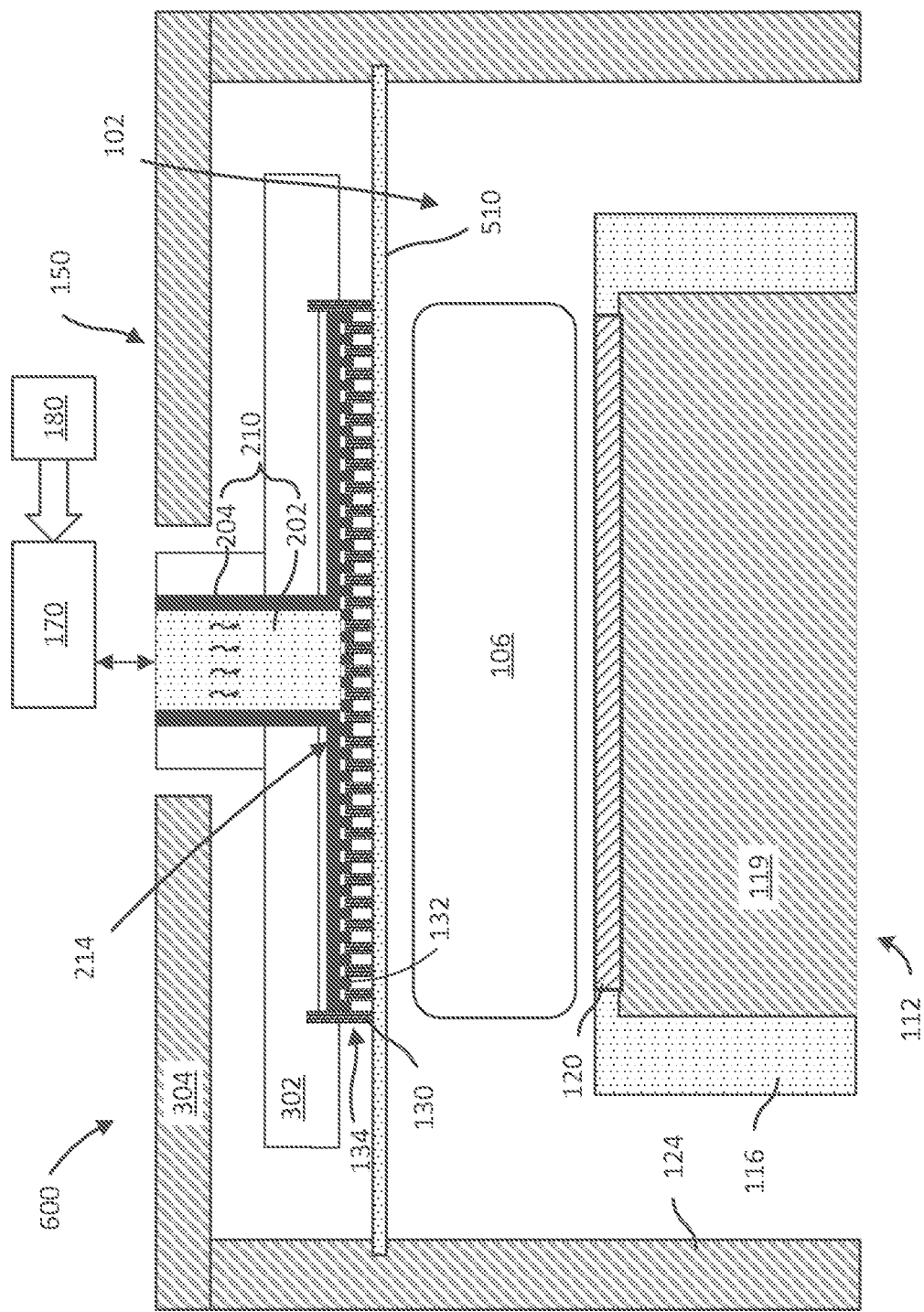
FIG. 6 is a cross-sectional view of a CCP processing chamber with a microwave waveguide in a top electrode and an EM metasurface below a top electrode of the CCP chamber, in accordance with an embodiment.

FIG. 6 illustrates another example plasma processing system 600 where, similar to the plasma processing system 500, the conductive spatial uniformity component 134 is attached to a side of the CCP electrode 302 above the plasma 106 in a plasma processing chamber 150 configured as a CCP chamber. As illustrated by the cross-sectional view in FIG. 6, plasma processing system 600 and the plasma processing system 500 are similar, except for the respective microwave source used to excite SSPP modes on the major surface 130 of the EM metasurface. In the plasma processing system 600, the microwave waveguide 210 is used to deliver microwave power to a central portion of the major surface 130 that is exposed to the waveguide 210 through an opening in the conductive plate of the depth adjuster 214. The vertical column of the depth adjuster 214 passing through a central region of the CCP electrode 302 is the waveguide 210.

Similar to the other embodiments of plasma processing systems described above, the resonant frequency of the unit pattern of the through openings in the major surface 130 of the plasma processing system 600 may be adjusted by the controller using a mechanical system of the depth adjuster 214 to select a desired unfilled depth, d, of the openings by sliding the conductive protrusions along the sidewalls of the openings. It is noted that, in plasma processing system 600, the microwave source (waveguide 210), the EM metasurface having the major surface (major surface 130), and the depth adjuster (depth adjuster 214) are disposed above the substrate holder 112 and the plasma 106 in the plasma processing chamber 150.

Figure 7:
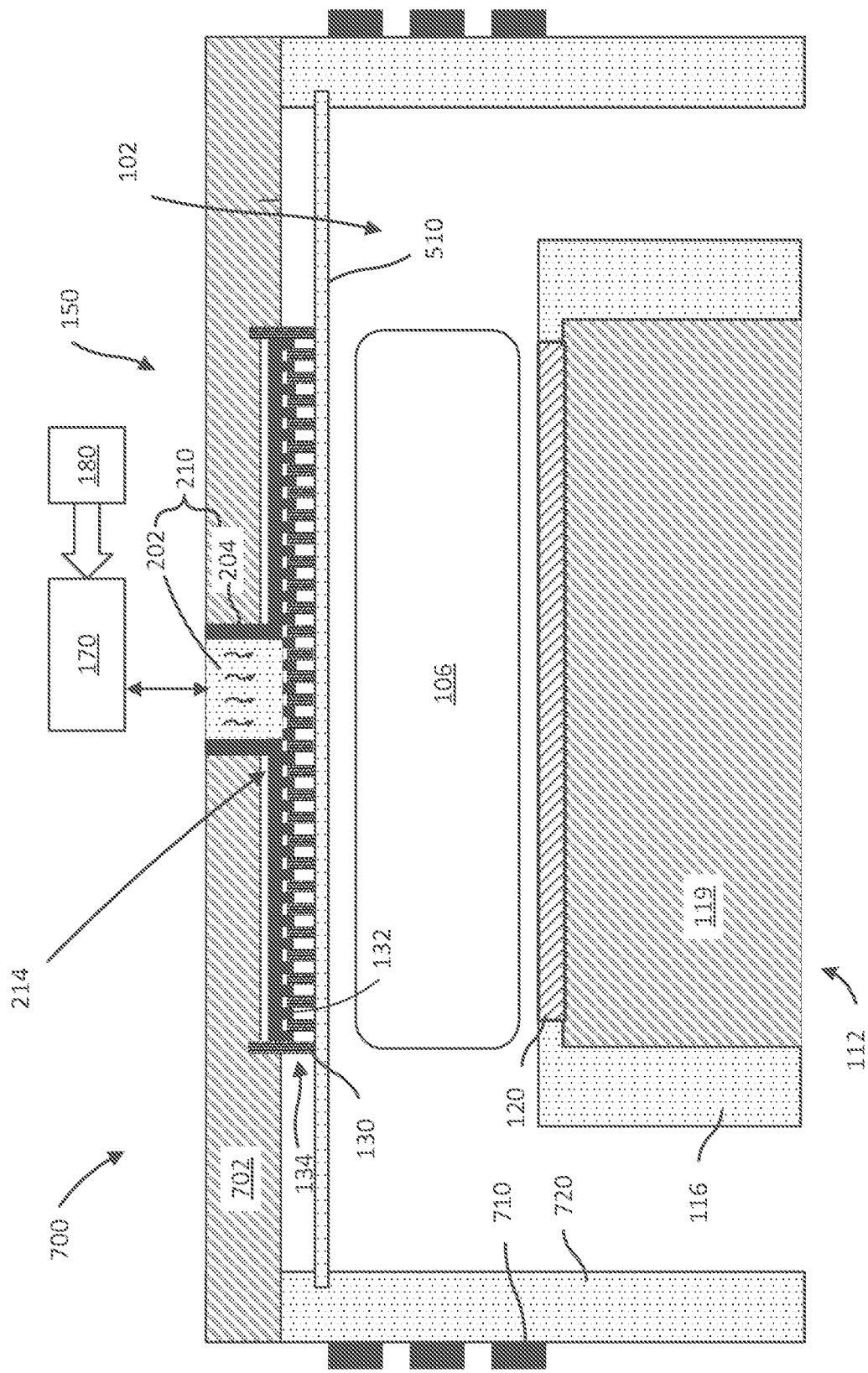
FIG. 7 is a cross-sectional view of an ICP processing chamber with a helical radio frequency (RF) coil on a sidewall, a microwave waveguide in a top cover, and an EM metasurface below a top cover of the ICP chamber, in accordance with an embodiment.

FIG. 7 illustrates a cross-sectional view of plasma processing system 700. Plasma processing system 700 is another example embodiment where, similar to the plasma processing system 600, the microwave source, the EM metasurface, and the depth adjuster are disposed above the substrate holder 112 and the plasma 106 in the plasma processing chamber 150.

In plasma processing system 700, the abovementioned components of the microwave power system are in a plasma processing chamber 150 configured as an ICP chamber, where the RF source electrode 710 is an RF coil shaped like a helix going around the sidewall 720 outside the plasma processing chamber 150. The sidewall 720 comprises the dielectric window adjacent to the RF source electrode 710, allowing the RF power to couple to gases in the chamber cavity 102 to ignite and sustain plasma 106. Similar to the plasma processing systems 500 and 600, the substrate holder 112 in the plasma processing system 700 comprises the conductive pedestal 119, described above with reference to FIGS. 5 and 6.

As illustrated in FIG. 7, the waveguide 210 doubles as the vertical column of the depth adjuster 214. The conductive outer wall 204 of the vertical column (which is also the waveguide 210) is connected to the side of the conductive plate opposite or adjacent to the side having conductive protrusions 132, as illustrated in FIG. 7 and similar to depth adjuster 214 in FIG. 6. However, unlike in FIG. 6, in FIG. 7, the conductive spatial uniformity component 134 with the major surface 130 is attached to a side of a top cover 702 of the plasma processing chamber 150 that is opposite the substrate holder 112. Accordingly, similar to the plasma processing system 600 illustrated in FIG. 6, the major surface 130 of the conductive spatial uniformity component 134 in the plasma processing system 700 illustrated in FIG. 7 is facing the chamber cavity 102 and the substrate holder 112. The vertical column (and waveguide 210) is passing through a central region of the top cover 702. Similar to the depth adjuster 214 of plasma processing system 600, the depth adjuster 214 of the plasma processing system 700 comprises a mechanical system 170 used to adjust the depth, d, of the hollow openings of the major surface 130. The mechanical system 170 may be configured to receive command instructions from the controller 180 to precisely achieve the specified depth adjustment.

Figure 8:
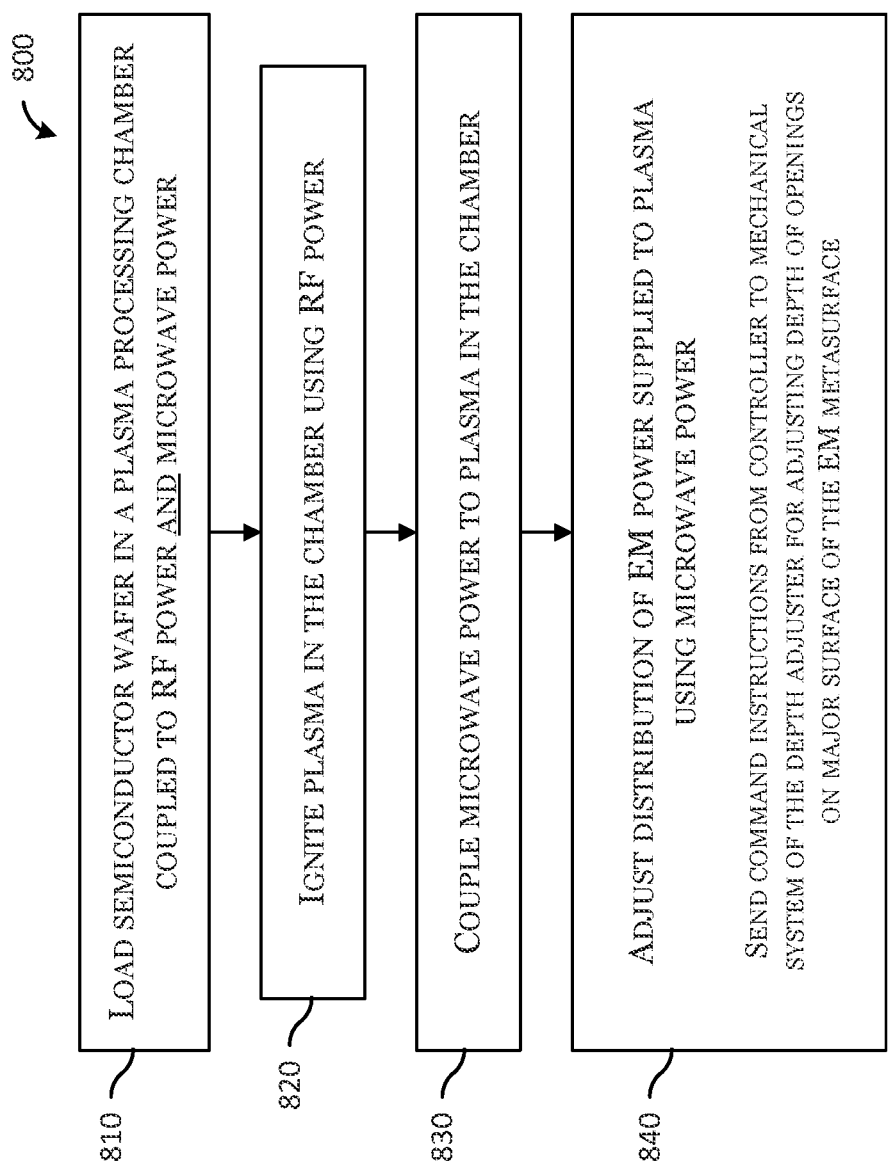
FIG. 8 is a flow diagram illustrating a method for plasma processing of a semiconductor wafer using RF power and microwave power, in accordance with an embodiment.

FIG. 8 is a flow diagram illustrating a method 800 for processing a semiconductor wafer by performing a plasma process using a plasma processing system such as the example embodiments of plasma processing systems 100,

200, 300, 400, 500, 600, and 700, described above with reference to FIGS. 1A-7. In these plasma processing systems, microwave power supplements RF power to provide several advantages mentioned above, such as the advantage of achieving more spatially uniform plasma and, hence, more spatially uniform characteristics for the processed semiconductor wafer. The method 800 for plasma processing is described below referring to FIGS. 1A-8.

The semiconductor wafer 120 may be loaded on the substrate holder 112 in the chamber cavity 102 of the plasma processing chamber 150, as indicated in box 810 in FIG. 8. An RF power source may be coupled to an RF source electrode to provide RF power to the plasma processing chamber 150 using a suitable configuration. For example, in an ICP configuration (FIGS. 1A, 2, and 7), an RF coil may be used as the RF source electrode, whereas in a CCP configuration (FIGS. 3-6), the CCP electrode 302 or the bottom electrode (the pedestals 118 and 119) may be used as the RF source electrode. A gaseous mixture of process and carrier gases may be flown at specified flow rates through the chamber cavity 102, and the gaseous mixture may be maintained, for example, at a low pressure controlled by a vacuum system coupled to the chamber cavity 102. The RF power from the RF source electrode may be coupled to the gaseous mixture to ignite and sustain plasma 106 in the chamber cavity 102, as indicated in box 820 in FIG. 8.

In addition to RF power, microwave power may be coupled to plasma 106, as indicated in box 830 in FIG. 8.

In the plasma processing systems 100, 300, and 500, microwave antennas 110 placed on the sidewalls 124 of the plasma processing chamber 150 may be the microwave source when coupled to a microwave oscillator 190. Coupling the microwave oscillator to the microwave antennas 110 may radiate microwaves into the chamber cavity 102. The radiated microwave power may electromagnetically couple to the major surface 130 of the EM metasurface and propagate from near the edge toward the center of the major surface 130.

In the plasma processing systems 200, 400, 600, and 700, the microwave waveguide 210 coupled to a microwave oscillator is the microwave source delivering microwave power to the conductive spatial uniformity component 134 (the EM metasurface). Waveguide 210 doubles as the vertical column of the depth adjuster 214 connected to the conductive plate with conductive protrusions 132 protruding into the hollow openings of the major surface 130 of the conductive spatial uniformity component 134. Coupling the waveguide 210 to the microwave oscillator results in microwave power being transmitted through the waveguide 210. Waveguide 210 terminates at a surface connected to the back side of the conductive plate of the depth adjuster 214. The microwave power through the waveguide may couple to a central region of the major surface 130 through the opening in the central region of the conductive plate of the depth adjuster 214. The microwave power from the waveguide 210 may excite EM surface waves in the major surface 130 and propagate the microwave power from the central region toward the edges of the major surface 130.

The frequency of the microwave oscillator may be selected to be at or near a resonant frequency of the unit pattern repeated in the major surface 130 of the conductive spatial uniformity component 134 of the respective plasma processing system. As explained above, microwave radiation at or near the resonant frequency of the repetitive pattern in the major surface may excite SSPP modes in the major surface. The surface microwave SSPP excitations result in an evanescent electric field within the plasma sheath. Accordingly, exciting the surface EM waves using microwave power received from the antennas 110 or the waveguide 210 comprises coupling the microwave power from the microwave source to the plasma 106.

The spatial distribution of the RF power and the microwave power may be complementary. Plasma powered by EM radiation at the higher microwave frequency (e.g., 2.45 GHz) may result in high density plasma, which has a radial distribution that is different from plasma sustained from the much lower RF frequency (e.g., 13.56 MHz and 27.15 MHz). For example, without the microwave source the plasma power density may be higher near the edge of the semiconductor wafer 120 relative to the center, indicating that there is a stronger coupling of RF power to plasma nearer the edge. The microwave power may couple more strongly closer to the center region; hence, a more uniform plasma power density may be achieved with the supplemental microwave power. Furthermore, the spatial distribution depends on various other plasma process parameters, such as chamber pressure and the plasma species. Because of these reasons, it is advantageous to adjust the spatial distribution of EM power to improve process uniformity and process control.

The spatial distribution of combined EM power coupled to the plasma 106 may be controllably adjusted by using the method 800, as described below with reference to box 840. In the plasma processing systems described above, command instructions may be sent from the controller 180 outside the chamber cavity 102 to the mechanical system 170 of the depth adjuster (e.g., depth adjuster 114 and depth adjuster 214) to adjust the resonant frequency of the unit pattern of the major surface 130 by adjusting the unfilled depth, d, as described above. As explained above, this adjustment may be utilized to adjust the spatial uniformity metric of EM power supplied to the plasma, e.g. a spatially localized magnitude of the EM power powering the plasma.

The microwave power delivered to the plasma processing chamber 150 may be less than the RF power delivered by the RF source electrode. In various embodiments the microwave power may be between 10% and 50% of the combined EM power supplied to the RF source electrode and the microwave source. If the microwave power is too small a fraction of the total EM power then it may not be effective in adjusting the spatial distribution of the total EM power coupled to the plasma 106. On the other hand, for a fixed total EM power specified for plasma processing, if the microwave power becomes the dominant source of EM power then the respective RE power may be insufficient to ignite and sustain the plasma 16, whereas, in the embodiments described in this disclosure, it is the RF power that is being used to ignite and sustain the plasma 106.

As indicated in box 840 in FIG. 8, microwave power may be used to adjust the distribution of the combined EM power supplied to plasma 106. The microwave power coupled to the SSPP excitations depends on the frequency of the EM radiation impinging on the major surface of the EM metasurface. The coupling would be strongest when the resonant frequency of the unit pattern of the major surface 130 matches the frequency of the microwave radiation. The coupling of microwave power to the EM metasurface reduces rapidly with increasing mismatch in frequency between the resonant frequency and the frequency of the microwave source. Furthermore, the attenuation of the excitations with distance depends on the frequency mismatch. Thus, adjusting the distribution of EM power may comprise adjusting the resonant frequency of the unit pattern of the major surface 130. As explained above, the resonant frequency may be adjusted by adjusting the depth, d, of the openings in the major surface 130 using the depth adjuster (e.g., depth adjuster 114 and depth adjuster 214).

The depth, d, may be selected using the depth adjuster in accordance with command instructions received from the controller 180 for the mechanical system 170 of the depth adjuster (e.g., depth adjuster 114 and depth adjuster 214) in the plasma processing systems 100, 200, 300, 400, 500, 600, and 700. The controller 180 may be configured to execute instructions, for example, instructions coded in a process recipe directing the controller 180 to send command instructions to the mechanical system 170 of the depth adjuster (e.g., depth adjuster 114 and depth adjuster 214) to select a desired depth, d, of openings on the major surface 130 of the conductive spatial uniformity component 134 to adjust the distribution of EM power supplied to plasma.

The embodiments of plasma processing systems described in this disclosure provide the advantages of achieving more uniform plasma and of having a plasma control parameter that may be used to adjust the distribution of EM power.

Example embodiments discussed in this application are summarized here. Other embodiments can also be understood from the entirety of the specification as well as the claims filed herein.

Example 1. A plasma processing system including: a vacuum system; a plasma processing chamber including: a chamber cavity (e.g., 102) coupled to the vacuum system; and a substrate holder (e.g., 112) including a surface disposed inside the chamber cavity; a radio frequency (RF) source electrode (e.g., 108) coupled to an RF power source, the RF source electrode configured to ignite plasma in the chamber cavity; a microwave source (e.g., 110) coupled to a microwave oscillator (e.g., 190); and a conductive spatial uniformity component (e.g., 134) including a plurality of through openings, the conductive spatial uniformity component including a major surface (e.g., 130, 230, 430, or 530) electromagnetically coupled to the microwave source, the major surface configured to couple microwave power to the plasma in the chamber cavity.

Example 2. The system of example 1, where the major surface is sealed from the chamber cavity by a separator (e.g., 122) including a solid dielectric covering the major surface.

Example 3. The system of one of examples 1 or 2, further including: a plurality of conductive protrusions configured to move relative to the conductive spatial uniformity component such that a depth distance, from the major surface to the conductive protrusions within the plurality of through openings is adjustable.

Example 4. The system of one of examples 1 to 3, where each of the plurality of through openings is shaped like a line, where the line has a length dimension greater than a width dimension.

Example 5. The system of one of examples 1 to 4, where each of the plurality of through openings is shaped like a prism having the same or similar lateral dimensions.

Example 6. The system of one of examples 1 to 5, further including a depth adjuster component including a conductive plate supporting the plurality of conductive protrusions, the depth adjuster component being aligned with the conductive spatial uniformity component such that the conductive protrusions are vertically aligned with the through openings; and a vertical column located opposite or adjacent to the conductive protrusions.

Example 7. The system of one of examples 1 to 6, further including a mechanical system configured to move the depth adjuster plate such that the plurality of conductive protrusions moves within the plurality of through openings, where the mechanical system is configured to receive command instructions from a controller configured to adjust the depth from outside the plasma processing chamber.

Example 8. The system of one of examples 1 to 7, where the controller is configured to adjust the depth in steps of 0.1 mm to 5 mm.

Example 9. The system of one of examples 1 to 8, where the substrate holder includes an electrically conductive pedestal, where the conductive spatial uniformity component is attached to the pedestal with the major surface of the conductive spatial uniformity component facing the chamber cavity, the major surface being isolated from ambient conditions within the chamber cavity by a separator including a solid dielectric layer covering the major surface.

Example 10. The system of one of examples 1 to 9, where the vertical column of the depth adjuster includes a microwave waveguide, one end of the waveguide being a terminating surface of the vertical column, the vertical column including a core that includes a dielectric core of the waveguide, and the conductive outer wall of the column being a conductive wall of the waveguide and; where a portion of the conductive spatial uniformity component is exposed to the end of the waveguide through a hole in the conductive plate, the hole being aligned to the terminating surface of the vertical column; and where the microwave source includes the microwave waveguide, the waveguide configured to deliver microwave power to the major surface.

Example 11. The system of one of examples 1 to 10, where the substrate holder includes an electrically conductive pedestal, where the conductive spatial uniformity component is attached to a portion of the pedestal with the major surface facing the chamber cavity, the major surface being sealed from the chamber cavity by a separator including a solid dielectric layer covering the major surface.

Example 12. The system of one of examples 1 to 11, where the plasma processing chamber is an inductively coupled plasma (ICP) chamber, the ICP chamber having a dielectric window, the dielectric window being a portion of a sidewall of the ICP chamber, where the RF source electrode is an RF coil shaped like a helix, the RF coil disposed outside the chamber cavity adjacent to the dielectric window, and where the conductive spatial uniformity component is attached to a bottom side of a top cover with the major surface facing the substrate holder, the major surface being sealed from the chamber cavity by a separator including a solid dielectric layer covering the major surface.

Example 13. The system of one of examples 1 to 12, where the plasma processing chamber is a capacitively coupled plasma (CCP) chamber, the CCP chamber having a CCP electrode shaped like a plate disposed opposite the substrate holder, the CCP electrode including a portion disposed inside the chamber cavity; and where the conductive spatial uniformity component is attached to the CCP electrode with the major surface facing the substrate holder, the major surface being sealed from the chamber cavity by a separator including a solid dielectric layer covering the major surface.

Example 14. A plasma processing system including: a plasma processing chamber; a radio frequency (RF) source electrode coupled to an RF power source, the RF source electrode configured to ignite plasma in the plasma processing chamber; a microwave power system coupled to the plasma with microwave power, the microwave power system including: a conductive spatial uniformity component including a plurality of through openings, the conductive spatial uniformity component including a major surface configured to couple microwave power to the plasma in the plasma processing chamber; a microwave source coupled to a microwave oscillator; and a controller configured to execute instructions to adjust a spatial uniformity metric of electromagnetic (EM) power supplied to the plasma.

Example 15. The system of example 14, where the microwave source includes a microwave waveguide configured to excite surface EM waves on the major surface.

Example 16. The system of one of examples 14 or 15, further including a depth adjuster component coupled to the plurality of through openings, the depth adjuster component including: a conductive surface including a plurality of protrusions extending into one end of the plurality of through openings, and where tips of each of the plurality of protrusions are positioned inside each of the plurality of through openings at a depth from the opposite end; and a mechanical system configured to slide the protrusions along sidewalls of the openings to vary the depth of the openings, the mechanical system configured to receive command instructions from the controller to move the plurality of protrusions.

Example 17. A method for plasma processing of a semiconductor wafer, the method including: loading the semiconductor wafer in a plasma processing chamber coupled to a radio frequency (RF) source electrode and a microwave power system including a conductive spatial uniformity component including a plurality of through openings, the conductive spatial uniformity component including a major surface coupled to a depth adjuster, a microwave oscillator and a microwave source; igniting plasma by coupling RF power from the RF source electrode to gas in the plasma processing chamber; coupling microwave power from the microwave power system to a plasma ignited in the plasma processing chamber by coupling the microwave oscillator to the microwave source; and changing, with the depth adjuster component, an unfilled depth of the plurality of through openings to control a combined electromagnetic (EM) power being supplied to the plasma where controlling the combined EM power adjusts a spatial uniformity metric of EM power.

Example 18. The method of example 17, where coupling the microwave oscillator to the microwave source includes providing microwave power between 10% and 50% of the combined EM power supplied to the RF source electrode and the microwave source.

Example 19. The method of one of examples 17 or 18, further including: exciting, with the microwave source, surface EM waves on the major surface.

Example 20. The method of one of examples 17 to 19, where adjusting the spatial uniformity metric of EM power includes sending command instructions from a controller to the microwave power system for adjusting the unfilled depth of the plurality of through openings on the major surface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma processing system comprising:
a vacuum system;
a plasma processing chamber comprising:
   a chamber cavity coupled to the vacuum system; and
   a substrate holder comprising a surface disposed inside the chamber cavity;
a radio frequency (RF) source electrode coupled to an RF power source, the RF source electrode configured to ignite plasma in the chamber cavity;
a microwave source coupled to a microwave oscillator;
a conductive spatial uniformity component comprising a plurality of through openings, the conductive spatial uniformity component comprising a major surface electromagnetically coupled to the microwave source, the major surface configured to couple microwave power to the plasma in the chamber cavity; and
a plurality of conductive protrusions configured to move relative to the conductive spatial uniformity component such that a depth distance, from the major surface to the conductive protrusions within the plurality of through openings is adjustable.

2. The system of claim 1, wherein the major surface is sealed from the chamber cavity by a separator comprising a solid dielectric covering the major surface.

3. The system of claim 1, wherein each of the plurality of through openings is shaped like a line, wherein the line has a length dimension greater than a width dimension.

4. The system of claim 1, wherein each of the plurality of through openings is shaped like a prism having the same or similar lateral dimensions.

5. The system of claim 1, further comprising a depth adjuster component comprising a conductive plate supporting the plurality of conductive protrusions, the depth adjuster component being aligned with the conductive spatial uniformity component such that the conductive protrusions are vertically aligned with the through openings; and
   a vertical column located opposite or adjacent to the conductive protrusions.

6. The system of claim 5, further comprising a mechanical system configured to move the conductive plate of the depth adjuster such that the plurality of conductive protrusions moves within the plurality of through openings, wherein the mechanical system is configured to receive command instructions from a controller configured to adjust the depth from outside the plasma processing chamber.

7. The system of claim 6, wherein the controller is configured to adjust the depth in steps of 0.1 mm to 5 mm.

8. The system of claim 5,
wherein the substrate holder comprises an electrically conductive pedestal,
wherein the conductive spatial uniformity component is attached to the pedestal with the major surface of the conductive spatial uniformity component facing the chamber cavity, the major surface being isolated from ambient conditions within the chamber cavity by a separator comprising a solid dielectric layer covering the major surface.

9. The system of claim 5,
wherein the vertical column of the depth adjuster comprises a microwave waveguide, one end of the waveguide being a terminating surface of the vertical column, the vertical column comprising a core that comprises a dielectric core of the waveguide, and the conductive outer wall of the column being a conductive wall of the waveguide and;
wherein a portion of the conductive spatial uniformity component is exposed to the end of the waveguide through a hole in the conductive plate, the hole being aligned to the terminating surface of the vertical column; and wherein the microwave source comprises the microwave waveguide, the waveguide configured to deliver microwave power to the major surface.

10. The system of claim 9,
wherein the substrate holder comprises an electrically conductive pedestal,
wherein the conductive spatial uniformity component is attached to a portion of the pedestal with the major surface facing the chamber cavity, the major surface being sealed from the chamber cavity by a separator comprising a solid dielectric layer covering the major surface.

11. The system of claim 9,
wherein the plasma processing chamber is an inductively coupled plasma (ICP) chamber, the ICP chamber having a dielectric window, the dielectric window being a portion of a sidewall of the ICP chamber,
wherein the RF source electrode is an RF coil shaped like a helix, the RF coil disposed outside the chamber cavity adjacent to the dielectric window, and
wherein the conductive spatial uniformity component is attached to a bottom side of a top cover with the major surface facing the substrate holder, the major surface being sealed from the chamber cavity by a separator comprising a solid dielectric layer covering the major surface.

12. The system of claim 9, wherein the plasma processing chamber is a capacitively coupled plasma (CCP) chamber, the CCP chamber having a CCP electrode shaped like a plate disposed opposite the substrate holder, the CCP electrode comprising a portion disposed inside the chamber cavity; and
wherein the conductive spatial uniformity component is attached to the CCP electrode with the major surface facing the substrate holder, the major surface being sealed from the chamber cavity by a separator comprising a solid dielectric layer covering the major surface.

13. A plasma processing system comprising:
a plasma processing chamber;
a radio frequency (RF) source electrode coupled to an RF power source, the RF source electrode configured to ignite plasma in the plasma processing chamber;
a microwave power system coupled to the plasma with microwave power, the microwave power system comprising:
  a conductive spatial uniformity component comprising a plurality of through openings, the conductive spatial uniformity component comprising a major surface configured to couple microwave power to the plasma in the plasma processing chamber;
  a microwave source coupled to a microwave oscillator;
a controller configured to execute instructions to adjust a spatial uniformity metric of electromagnetic (EM) power supplied to the plasma; and
a depth adjuster component coupled to the plurality of through openings, the depth adjuster component comprising:
  a conductive surface comprising a plurality of protrusions extending into one end of the plurality of through openings, and wherein tips of each of the plurality of protrusions are positioned inside each of the plurality of through openings at a depth from the opposite end; and
  a system configured to slide the protrusions along sidewalls of the openings to vary the depth of the openings, the system configured to receive command instructions from the controller to move the plurality of protrusions.

14. The system of claim 13, wherein the microwave source comprises a microwave waveguide configured to excite surface EM waves on the major surface.

15. A method for plasma processing of a semiconductor wafer, the method comprising:
loading the semiconductor wafer in a plasma processing chamber coupled to a radio frequency (RF) source electrode and a microwave power system comprising a conductive spatial uniformity component comprising a plurality of through openings, the conductive spatial uniformity component comprising a major surface coupled to a depth adjuster, a microwave oscillator and a microwave source;
igniting plasma by coupling RF power from the RF source electrode to gas in the plasma processing chamber;
coupling microwave power from the microwave power system to a plasma ignited in the plasma processing chamber by coupling the microwave oscillator to the microwave source; and
changing, with the depth adjuster, an unfilled depth of the plurality of through openings to control a combined electromagnetic (EM) power being supplied to the plasma, wherein controlling the combined EM power adjusts a spatial uniformity metric of EM power.

16. The method of claim 15, wherein coupling the microwave oscillator to the microwave source comprises providing microwave power between 10% and 50% of the combined EM power supplied to the RF source electrode and the microwave source.

17. The method of claim 15, further comprising:
exciting, with the microwave source, surface EM waves on the major surface.

18. The method of claim 15, wherein adjusting the spatial uniformity metric of EM power comprises sending command instructions from a controller to the microwave power system for adjusting the unfilled depth of the plurality of through openings on the major surface.

* * * * *